United States Patent
Zhou et al.

(10) Patent No.: US 8,361,869 B2
(45) Date of Patent: Jan. 29, 2013

(54) METHOD FOR MANUFACTURING SUSPENDED FIN AND GATE-ALL-AROUND FIELD EFFECT TRANSISTOR

(75) Inventors: Huajie Zhou, Beijing (CN); Yi Song, Beijing (CN); Qiuxia Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 69 days.

(21) Appl. No.: 13/133,737

(22) PCT Filed: Feb. 17, 2011

(86) PCT No.: PCT/CN2011/071062
§ 371 (c)(1),
(2), (4) Date: Jun. 9, 2011

(87) PCT Pub. No.: WO2012/075728
PCT Pub. Date: Jun. 14, 2012

(65) Prior Publication Data
US 2012/0149162 A1  Jun. 14, 2012

(30) Foreign Application Priority Data

Dec. 8, 2010 (CN) .......................... 2010 1 0578567
Dec. 8, 2010 (CN) .......................... 2010 1 0578678

(51) Int. Cl.
*H01L 21/336* (2006.01)

(52) U.S. Cl. .......... 438/289; 438/44; 438/149; 438/176; 438/197; 438/230; 438/265; 438/283; 438/303; 438/481; 438/595; 438/506; 438/698; 438/712; 257/308; 257/465; 257/E21.014; 257/E21.092; 257/E21.097; 257/E23.133; 257/E29.131; 257/E29.152

(58) Field of Classification Search .................. None
See application file for complete search history.

(56) References Cited

U.S. PATENT DOCUMENTS

2009/0014802 A1*  1/2009  Kawakita .................. 257/365

\* cited by examiner

*Primary Examiner* — Julio J Maldonado
*Assistant Examiner* — Yasserr Abdelaziez
(74) *Attorney, Agent, or Firm* — Westman, Champlin & Kelly, P.A.

(57) ABSTRACT

The present application discloses a method for manufacturing a gate-all-around field effect transistor, comprising the steps of: forming a suspended fin in a semiconductor substrate; forming a gate stack around the fin; and forming source/drain regions in the fin on both sides of the gate stack, wherein an isolation dielectric layer is formed in a portion of the semiconductor substrate which is adjacent to bottom of both the fin and the gate stack. The present invention relates to a method for manufacturing a gate-all-around device on a bulk silicon substrate, which suppress a self-heating effect and a floating-body effect of the SOI substrate, and lower a manufacture cost. The inventive method is a conventional top-down process with respect to a reference plane, which can be implemented as a simple manufacture process, and is easy to be integrated into and compatible with a planar CMOS process. The inventive method suppresses a short channel effect and promotes miniaturization of MOSFETs.

19 Claims, 3 Drawing Sheets

METHOD FOR MANUFACTURING SUSPENDED FIN AND GATE-ALL-AROUND FIELD EFFECT TRANSISTOR

CROSS-REFERENCE TO RELATED APPLICATION

This Application is a Section 371 National Stage Application of International Application No. PCT/CN2011/071062, filed Feb. 17, 2011, not yet published, which claims priority to CN 201010578567.9, filed on Dec. 8, 2010 and CN 201010578678.X, filed on Dec. 8, 2010, the entire contents of which are hereby incorporated by reference in their entirety.

BACKGROUND OF THE INVENTION

1. Field of Invention

The present invention relates to semiconductor technology, and more particularly, to a method for manufacturing a suspended fin and a gate-all-around field effect transistor on a bulk silicon.

2. Description of Prior Art

The integrated circuit industry continues developing according to Moore's law and the feature size of CMOS devices is becoming smaller and smaller. A planar CMOS device on a bulk silicon is facing with severe challenges, such as a short channel effect (SCE), leakage current between the source and the drain, a drain induced barrier lowering effect (DIBL), and the like. To solve the above problems, many novel device structures are proposed, in which a gate structure of the device is changed from the initial single-gate structure to a double-gate structure (i.e. FinFET), a multi-gate structure, or even a surrounding gate which surrounds the channel completely. With an increase of the number of the gate, the gate controllability and the capability of suppressing the short channel effect are enhanced. The above novel device structures, such as a double-gate (FinFET), a multi-gate, or even a gate-all-around device, all involve the fabrication of a channel having a fin structure. Specifically, a suspended fin structure should be fabricated for a gate-all-around device.

Up to now, an SOI substrate is used for manufacturing a gate-all-around device. Since an SOI substrate has a natural buried oxide layer (BOX) which can be used as a sacrificial layer, it facilitates the manufacture of a gate-all-around device. The SOI substrate has the following beneficial effects: easily isolating the devices by a natural buried oxide layer in the SOI substrate, which avoids a latch up effect in a bulk silicon substrate; simplifying the manufacturing process; easily suppressing a parasitic transistor at the bottom; smaller parasitic capacitance; high speed; and good anti-radiation performance. However, there are still many problems in manufacturing a gate-all-around device with an SOI substrate. For example, since the SOI substrate has a self-heating effect and a floating-body effect, complicated source/drain engineering should be introduced into the manufacture process so as to decrease parasitic resistance between the source and the drain.

Since a bulk silicon substrate is still used in a mainstream semiconductor manufacture process at present, researches are focused on forming a gate-all-around device in a bulk silicon substrate, which has important significance in application of a gate-all-around device and the development of the semiconductor industry. To manufacture a gate-all-around device in a bulk silicon substrate, one should first consider how to fabricate a suspended fin structure in a bulk silicon substrate.

SUMMARY OF THE INVENTION

One object of the present invention is to provide a novel method for manufacturing a suspended fin and a gate-all-around field effect transistor, which is easy to be integrated into and compatible with a planar CMOS process.

According to one aspect of the present invention, there provides a method for manufacturing a suspended fin, comprising the steps of: forming a dielectric layer on a semiconductor substrate; etching the dielectric layer and the semiconductor substrate so as to form at least two trenches embedded in the semiconductor substrate and a fin between the trenches; forming a sidewall spacer at side surfaces of the fin; etching a portion of the semiconductor substrate at bottom of the trenches and below the fin so as to form a suspended fin; and forming an isolation dielectric layer at bottom of the trenches and below the fin.

According to another aspect of the present invention, there provides a method for manufacturing a gate-all-around field effect transistor, comprising the steps of: forming a suspended fin in a semiconductor substrate; forming a gate stack around the fin; and forming source/drain regions on both sides of the gate stack in the fin, wherein an isolation dielectric layer is formed in a portion of the semiconductor substrate which is adjacent to bottom of both the fin and the gate stack.

Preferably, the step of forming a suspended fin in a substrate comprises the steps of: forming a dielectric layer on a semiconductor substrate; etching the dielectric layer and the semiconductor substrate so as to form at least two trenches embedded in the semiconductor substrate and a fin between the trenches; forming a sidewall spacer at side surfaces of the fin; etching a portion of the semiconductor substrate at the bottom of the trenches and below the fin so as to form a suspended fin; and forming an isolation dielectric layer at the bottom of the trenches and below the fin.

Preferably, the dielectric layer comprises $SiO_2$, TEOS or $Si_3N_4$.

Preferably, the fin has a width of 10-60 nm.

Preferably, the second dielectric layer comprises $SiO_2$ or TEOS and has a thickness of 20-60 nm.

Preferably, the step of forming a sidewall spacer at side surfaces of the fin comprises the steps of: forming a second dielectric layer on the semiconductor substrate; and etching the second dielectric layer so as to form a sidewall spacer.

Preferably, the step of etching a portion of the semiconductor substrate at the bottom of the trenches and below the fin so as to form a suspended fin comprises the steps of: etching the semiconductor substrate through the trenches by an isotropic etching process so that the trenches further extend into the semiconductor substrate, and extend towards the bottom of the fin until two adjacent trenches communicate with each other below the fin, so as to form a suspended fin.

Preferably, the isolation dielectric layer comprising a filling dielectric layer, and the step of forming the isolation dielectric layer at the bottom of the trenches and below the fin comprises the step of: forming a filling dielectric layer on the semiconductor substrate; etching the filling dielectric layer back so as to expose the fin completely, wherein the remaining portion of the filling dielectric layer at the bottom of the trenches providing the isolation dielectric layer having a thickness of 50-300 nm.

Preferably, the step of forming a gate stack around the fin comprises the steps of: forming a gate dielectric layer and a gate electrode material around the suspended fin; and forming a gate stack by lithography and etching.

In the preferable embodiment of the present invention, before forming source/drain regions on both sides of the gate stack in the fin, the method further comprises the step of forming source/drain extensions in the fin by tilt angle ion implantation. Optionally, it further comprises the step of forming implanted halos in the fin by tilt angle ion implantation.

Preferably, the step of forming source/drain regions on both sides of the gate stack in the fin comprises the steps of forming sidewall spacers on both sides of the fin; doping source/drain regions by ion implantation; and forming source/drain silicides. In the preferable embodiment of the present invention, the semiconductor substrate is a bulk silicon substrate.

With the above technical solutions, the present invention has the following beneficial effects.

1) The present invention relates to a method for manufacturing a suspended fin which provides a fin on a bulk silicon substrate and facilities the manufacture of a gate-all-around device on a bulk silicon substrate.

2) The present invention relates to a method for manufacturing a suspended fin which can be implemented as a simple manufacture process, is easy to be integrated into and compatible with a planar CMOS process.

3) The present invention relates to a method for manufacturing a suspended fin which has an oxide layer as an isolation structure at the bottom, which can suppress a bottom parasitic transistor, eliminate a bottom leakage passage, and improve properties of the device.

4) The present invention relates to a method for manufacturing a gate-all-around device which can be implemented on a bulk silicon substrate, suppress a self-heating effect and a floating-body effect of the SOI substrate, and lower a manufacture cost.

5) The present invention relates to a method for manufacturing a gate-all-around device which can be implemented as a simple manufacture process, is easy to be integrated into and compatible with a planar CMOS process.

6) The present invention relates to a method for manufacturing a gate-all-around device which avoids selective epitaxial growth on source/drain regions or the like for reducing a series resistance in the source/drain regions, and reduces dependencies on manufacturing equipments, and can be easily implemented.

BRIEF DESCRIPTION OF THE DRAWINGS

The above and other objects, advantages and features of the present invention will become more fully understood from the detailed description given hereinbelow in connection with the appended drawings, and wherein.

LIST OF REFERENCE SIGNS

101: Si substrate; 102: STI; 103 dielectric layer; 104: trench structure; 105: fin; 106: sidewall spacer; 107: filling dielectric layer; 108: gate dielectric layer; 109: gate electrode.

It should be noted that the drawings appended to the description are only for illustrative purpose, but not drawn to scale. Thus, the appended drawings should not be construed as limiting or constraining the protection scope of the present invention. In the appended drawings, like component members are designated by like reference signs.

DETAILED DESCRIPTION OF PREFERRED EMBODIMENTS

The present invention will be described below with those preferred embodiments in connection with attached drawings. However, it should be understood that the descriptions here are only illustrative, without an intend of limiting the protection scope of the present invention. Also, the following description omits details of those known structure and techniques so that concepts of the invention are not obscured unnecessarily.

Schematic layer structure according to one embodiment of the present invention is shown in the figures. However, these figures are not drawn to scale, and some details may be exaggerated and other details may be omitted for simplicity. Shapes, relative sizes and positions of various regions/layers shown in the figures are only illustrative. Variations may exist due to manufacturing tolerance and technical limitations. Moreover, those skilled in the art may design the regions/layers having different shapes, relative sizes and positions in view of actual requirement.

FIGS. 1-8 are cross sectional views of the semiconductor structure at various stages of the process for manufacturing a fin according to one embodiment of the present invention. The steps according to one embodiment of the present invention will be described in detail hereinafter in connection with the appended drawings.

Figure 1:
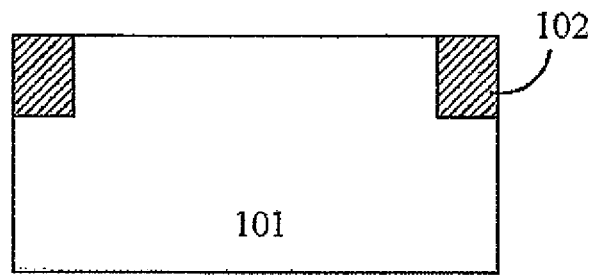
FIGS. 1-8 are cross sectional views of the semiconductor structure at various stages of the process for manufacturing a gate-all-around field effect transistor according to one embodiment of the present invention.

First, referring to FIG. 1, shallow trench isolations (STIs) 102 are formed in a semiconductor substrate 101. Specifically, the semiconductor substrate 101 can be made of a substrate material well known in the field of semiconductor manufacturing. In the embodiment of the present invention, it is preferably a bulk Si substrate.

Figure 2:
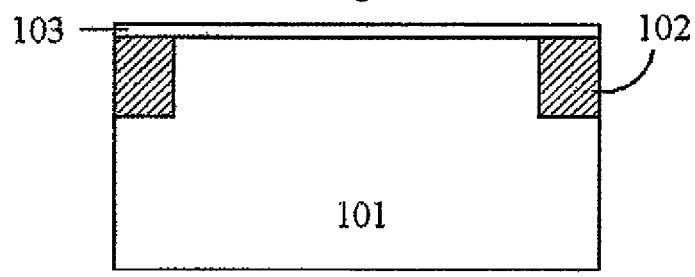

As shown in FIG. 2, a dielectric layer 103 is then formed on the semiconductor substrate 101. The dielectric layer 103 can be made of SiO2, TEOS, Si3N4, or other dielectric materials. In the embodiment of the present invention, it is preferably made of SiO2, which can be formed by thermal growth and has a thickness of about 30-70 nm. The dielectric layer 103 effectively protects a fin to be formed during the subsequent etching process.

Figure 3A:
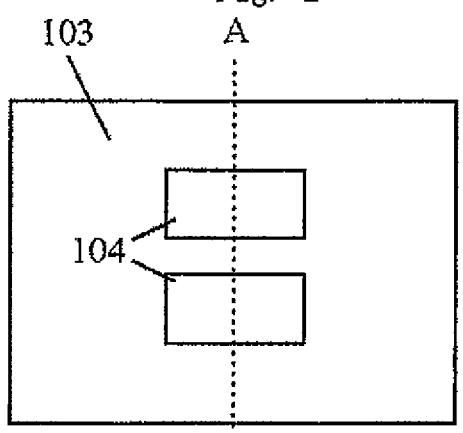
Figure 3B:
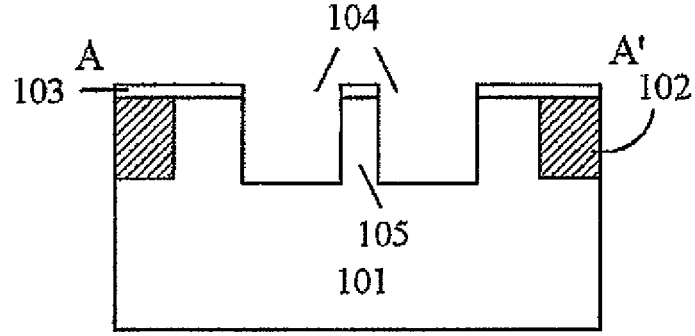

FIG. 3A shows a top view of the semiconductor substrate 101, and FIG. 3B is a cross sectional view taken along line AA in FIG. 3A. As shown in FIGS. 3A and 3B, the semiconductor substrate 101 is etched to form at least two trenches which are embedded in the semiconductor substrate 101. Although only two trenches are shown in the figures, it is apparent for one skilled person that there can be any number of trenches in the semiconductor substrate 101. The etching process for forming the trenches 104 can be, for example, performing electron beam lithography on a positive photoresist and performing reactive ion etching to form two adjacent steep trenches 106 which have a dimension of about 400 nm*400 nm and a spacing of 10-60 Mt The shape of the trenches is only illustrative and there is no limitation to this in the present invention. A fin 105 is formed between the trenches, which is also referred as "a silicon island". The fin has a width which may be selected as appropriate, for example, 10-60 nm.

Figure 4:
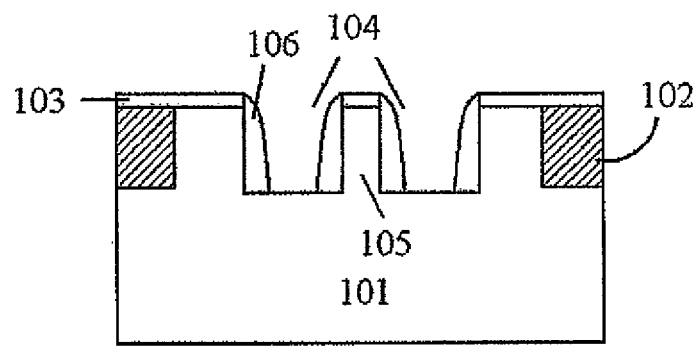

FIG. 4 is a schematic view of the semiconductor structure after sidewall spacers are formed in the semiconductor structure shown in FIG. 3. As shown in FIG. 4, the sidewall spacers are formed at both sides of the fin 105. The sidewall spacers may have a single-layer or multi-layer structure, and may have a "D" shape or "I" shape or other shapes. There is no limitation without any limitation to this in the present invention. The formation of sidewall spacers protects the fin 105 from being damaged during the subsequent etching process.

First, a second dielectric layer is formed to cover the whole semiconductor structure, which, for example, is made of SiO2, TEOS, or other dielectric materials. In the embodiment of the present invention, it is preferably TEOS. The second dielectric layer can be formed by chemical vapor deposition, atomic layer deposition, or other approaches, and may have a thickness of about 20-60 nm. The second dielectric layer is then etched, for example, by reactive ion etching (RIE) so as to form sidewall spacers 106.

Figure 5:
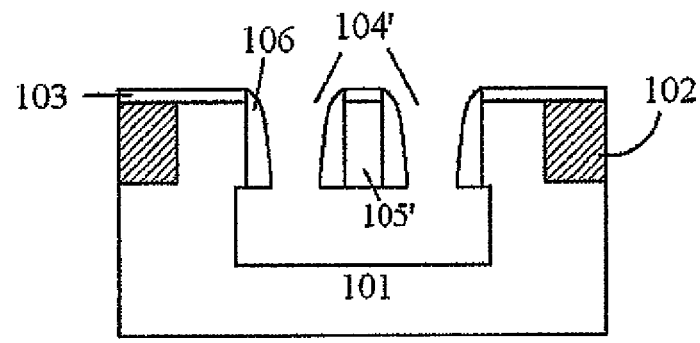

As shown in FIG. 5, a suspended fin 105' is then formed at the bottom of the trenches 104 and below the fin 105. Specifically, the semiconductor substrate 101 is further etched through the trenches 104 so that the trenches 104 further extend into the semiconductor substrate 101, which increase the depth of the trenches 104, and extend towards the bottom of the fin 105 until two adjacent trenches 104 communicate with each other below the fin 105, so as to form a suspended fin 105' and trenches 104' which communicate with each other at the bottom. The further etching through the trenches 104 includes isotropic dry etching or wet etching. Preferably, dry etching is used for the further etching through the trenches 104, up to a depth of 100-300 nm below the bottom of the fin 105 in the semiconductor substrate 101. Alternatively, wet etching can also be used. The etching rate and time in the etching process may be controlled in accordance with the thickness of the fin 105, so as to ensure that a portion of the silicon substrate below the fin is etched away completely and the adjacent trenches communicate completely with each other at respective bottom portions in the etching process.

Figure 6:
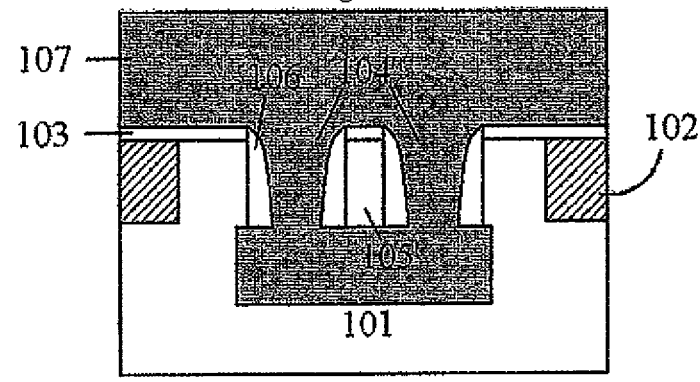
Figure 7:
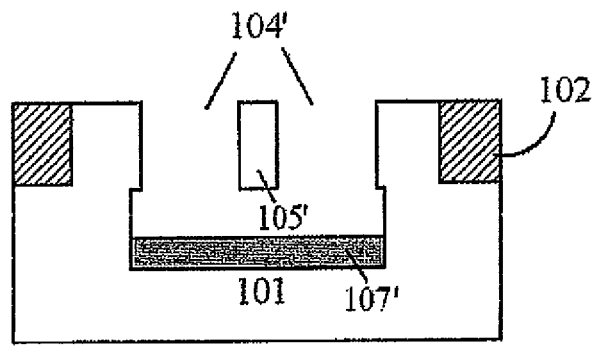

As shown in FIGS. 6 and 7, an isolation dielectric layer 107' is then formed at the bottom of the trenches 104' and below the fin 105' in the semiconductor substrate. First, referring to FIG. 6, a filling dielectric layer 107 is deposited on the semiconductor substrate, which fills the whole trenches 104' and the cavity below the fin 105'. The filling dielectric layer 107 is made of SiO2, TEOS, low temperature oxide (LTO), or other dielectric materials. In the embodiment of the present invention, it is preferably made of TEOS. The filling dielectric layer 107 can be formed by chemical vapor deposition (CVD), and can have a thickness of about 250-500 nm. As shown in FIG. 7, the filling dielectric layer 107 is etched back so as to completely expose the suspended fin 105', and a portion of the filling dielectric layer 107 remains at the bottom of the trenches, which forms an isolation dielectric layer 107' for providing isolation between the device and the substrate. The isolation dielectric layer 107' facilitates suppressing formation of bottom parasitic transistors, eliminating leakage current passage at bottom, and improving performance of the device. In the etchback, the dielectric layer at the top of the suspended fin 105' and the sidewall spacers at both sides of the suspended fin 105' are both removed, and a portion of the filling dielectric layer below the suspended fin 105' is removed so that the trenches 104' communicate with each other at respective bottom portions.

A suspended fin according to one embodiment of the present invention is thus formed. In the semiconductor structure shown in FIG. 7, there is an isolation dielectric layer 107' below the fin which facilitates suppressing formation of bottom parasitic transistors, eliminating leakage current passage at bottom, and improving performance of the device.

Figure 8:
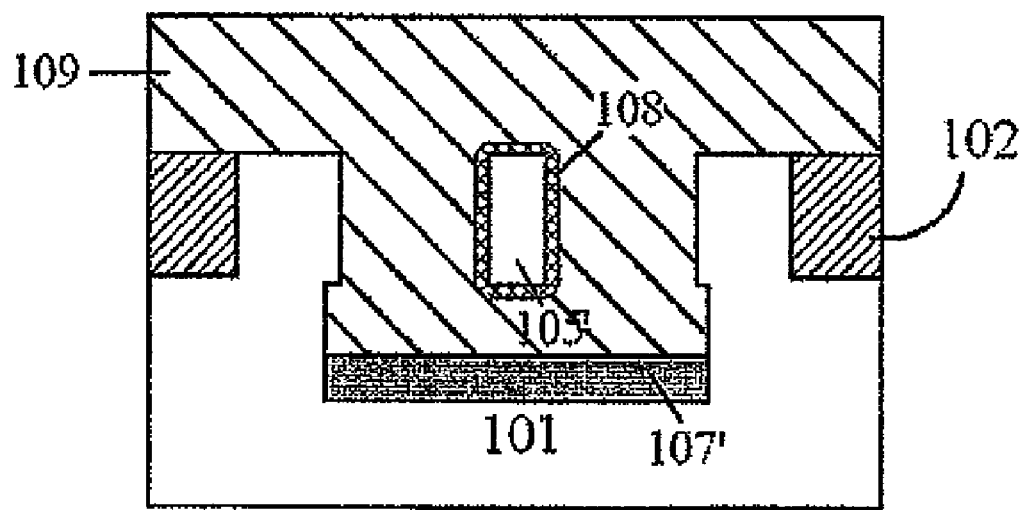

As shown in FIG. 8, a gate dielectric layer 108 and a gate electrode 109 are then formed on the whole semiconductor substrate, and are further etched to provide a gate stack. The gate dielectric layer 108 can be made of conventional gate dielectrics, such as SiO2, or other high K dielectrics, such as SiON, HfAlON, HfTaON, HfSiON, Al2O3, or the like. In one embodiment of the present invention, it is preferably made of HfSiON. The gate dielectric layer 108 can be formed by low pressure chemical vapor deposition, metal-organic chemical vapor deposition, atomic layer deposition, or the like, and has an equivalent oxide thickness (EOT) of 5-100 Å. The gate electrode 109 can be made of refractory metals, such as W, Ti, Ta, Mo, or metal nitrides, such as TiN, TaN, HfN, MoN, or other materials. The gate electrode 109 can be formed by low pressure chemical vapor deposition, metal-organic chemical vapor deposition, atomic layer deposition, or the like, and has a thickness of 2000-5000 Å.

Optionally, after forming the gate stack, the method further comprises the step of performing tilt angle ion implantation so as to form source/drain extensions in the fin; or performing tilt angle ion implantation so as to form implanted halos in the fin. A gate sidewall spacer is then formed at side surfaces of the gate stack. The formation of the gate sidewall spacer can be implemented with conventional methods, which will not be described in detail here.

Ion implantation is then performed on both sides of the gate stack in the semiconductor substrate so as to form source/drain regions, and the source/drain regions are then silicided.

Finally, interconnects are formed by metallization for being coupled with electrodes. The metallization can be implemented with conventional methods, which will not be described in detail here.

Moreover, the above embodiment of the present invention illustrates formation of a suspended fin in a bulk silicon substrate, which facilitates manufacturing a gate-all-around device in a bulk silicon substrate. The inventive method is a typical quasi-planar top-down process, which can be implemented by a simple manufacture process, and is easy to be integrated into and compatible with a planar CMOS process.

In the above description, no details are given for patterning and etching various layers. Nevertheless, one skilled person will appreciate that the layers and regions having desired shapes can be formed by various approaches well known in the field. Moreover, one skilled person may propose a process completely different from the above processes for providing the same structure.

Various embodiments of the present invention have been described above. It should be understood that they have been presented by way of example, and not limitation on the protection scope of the present invention. The protection scope is defined by the attached claims and their equivalences. One skilled person will readily recognize that various modifications and changes may be made to the present invention, without departing from the true scope of the present invention.

What is claimed is:

1. A method for manufacturing a suspended fin, comprising the steps of:
    forming a dielectric layer on a semiconductor substrate;
    etching the dielectric layer and the semiconductor substrate so as to form at least two trenches embedded in the semiconductor substrate and a fin between the trenches;
    forming a sidewall spacer at side surfaces of the fin;
    etching a portion of the semiconductor substrate at bottom of the trenches and below the fin so as to form a suspended fin; and
    forming an isolation dielectric layer at bottom of the trenches and below the fin.

2. The method according to claim 1, wherein the dielectric layer comprises at least one of SiO2, TEOS and Si3N4.

3. The method according to claim 1, wherein the fin has a width of 10-60 nm.

4. The method according to claim 1, wherein the step of forming a sidewall spacer at side surfaces of the fin comprises the steps of:
- forming a second dielectric layer on the semiconductor substrate; and
- etching the second dielectric layer so as to form a sidewall spacer.

5. The method according to claim 4, wherein the second dielectric layer comprises SiO2 or TEOS, and has a thickness of 20-60 nm.

6. The method according to claim 1, wherein the step of etching a portion of the semiconductor substrate at bottom of the trenches and below the fin so as to form a suspended fin comprises the steps of:
- etching the semiconductor substrate through the trenches by an isotropic etching process so that the trenches further extend into the semiconductor substrate and extend towards the bottom of the fin until two adjacent trenches communicate with each other below the fin, so as to form a suspended fin.

7. The method according to claim 1, wherein the isolation dielectric layer comprising a filling dielectric layer, and the step of forming the isolation dielectric layer at bottom of the trenches and below the fin comprises the step of:
- forming a filling dielectric layer on a semiconductor substrate; and
- etching the filling dielectric layer back so as to expose the fin completely, wherein the remaining portion of the filling dielectric layer at bottom of the trenches provides the isolation dielectric layer.

8. The method according to claim 7, wherein the isolation dielectric layer has a thickness of 50-300 nm.

9. A method for manufacturing a gate-all-around field effect transistor, comprising the steps of:
- forming a suspended fin in a semiconductor substrate;
- forming a gate stack around the fin; and
- forming source/drain regions on both sides of the gate stack in the fin,
- wherein an isolation dielectric layer is formed in a portion of the semiconductor substrate which is adjacent to bottom of both the fin and the gate stack.

10. The method according to claim 9, wherein the step of forming a suspended fin in a substrate comprises the steps of:
- forming a dielectric layer on a semiconductor substrate;
- etching the dielectric layer and the semiconductor substrate so as to form at least two trenches embedded in the semiconductor substrate and a fin between the trenches;
- forming a sidewall spacer at side surfaces of the fin;
- etching a portion of the semiconductor substrate at bottom of the trenches and below the fin so as to form a suspended fin; and
- forming an isolation dielectric layer at bottom of the trenches and below the fin.

11. The method according to claim 10, wherein the dielectric layer comprises SiO2, TEOS or Si3N4.

12. The method according to claim 10, wherein the fin has a width of 10-60 nm.

13. The method according to claim 10, wherein the step of forming a sidewall spacer at side surfaces of the fin comprises the steps of:
- forming a second dielectric layer on the semiconductor substrate; and
- etching the second dielectric layer so as to form a sidewall spacer.

14. The method according to claim 10, wherein the step of etching a portion of the semiconductor substrate at bottom of the trenches and below the fin so as to form a suspended fin comprises the steps of:
- etching the semiconductor substrate through the trenches by an isotropic etching process so that the trenches further extend into the semiconductor substrate, and extend towards the bottom of the fin until two adjacent trenches communicate with each other below the fin, so as to form a suspended fin.

15. The method according to claim 10, wherein the isolation dielectric layer comprising a filling dielectric layer, and the step of forming the isolation dielectric layer at bottom of the trenches and below the fin comprises the step of:
- forming a filling dielectric layer on a semiconductor substrate; and
- etching the filling dielectric layer back so as to expose the fin completely, wherein the remaining portion of the filling dielectric layer at bottom of the trenches provides the isolation dielectric layer.

16. The method according to claim 15, wherein the isolation dielectric layer has a thickness of 50-300 nm.

17. The method according to claim 9, wherein the step of forming a gate stack around the fin comprises the steps of:
- forming a gate dielectric layer and a gate electrode material around the suspended fin; and
- forming a gate stack by lithography and etching.

18. The method according to claim 9, wherein before forming source/drain regions on both sides of the gate stack in the fin, the method further comprises the step of:
- forming source/drain extensions in the fin by tilt angle ion implantation; or
- forming implanted halos in the fin by tilt angle ion implantation.

19. The method according to claim 9, wherein the step of forming source/drain regions on both sides of the gate stack in the fin comprises the step of:
- forming sidewall spacers on both sides of the fin;
- doping source/drain regions by ion implantation; and
- forming source/drain silicides.

* * * * *